United States Patent [19]

Ochii

[11] Patent Number: 5,262,988
[45] Date of Patent: Nov. 16, 1993

[54] DYNAMIC MEMORY CELL AND DYNAMIC MEMORY

[75] Inventor: Kiyofumi Ochii, Yokohama, Japan

[73] Assignee: Kabushiki Kaisha Toshiba, Kawasaki, Japan

[21] Appl. No.: 882,867

[22] Filed: May 14, 1992

[30] Foreign Application Priority Data

May 17, 1991 [JP] Japan ............................ 3-113521

[51] Int. Cl.⁵ ............................................ G11C 7/00
[52] U.S. Cl. .................................... 365/188; 365/150; 365/222
[58] Field of Search ............... 365/150, 187, 188, 222

[56] References Cited

U.S. PATENT DOCUMENTS

| | | | |
|---|---|---|---|
| 3,876,993 | 4/1975 | Cavanaugh | 365/222 |
| 4,030,083 | 6/1977 | Boll | 365/222 |
| 4,161,791 | 7/1979 | Leach | 365/222 |
| 4,247,919 | 1/1981 | White, Jr. et al. | 365/222 |
| 4,352,997 | 10/1982 | Raymond, Jr. et al. | 365/222 X |

Primary Examiner—Eugene R. LaRoche
Assistant Examiner—Christopher R. Glembocki
Attorney, Agent, or Firm—Finnegan, Henderson, Farabow, Garrett & Dunner

[57] ABSTRACT

A dynamic memory cell includes a first MOS transistor for data transfer connected at one end to a read/write node and having a gate connected to a transfer gate control line, a second MOS transistor having a gate connected to a first storage node on the other end side of the first MOS transistor and a gate capacitor used as a data storage capacitor, a third MOS transistor for refresh current supply connected at one end to the first storage node, and a resistor element or switching element connected between the gate of the third MOS transistor and the other end of the second MOS transistor. The cell itself has the refresh current supplying capability and it is not necessary to effect the refresh operation on the read/write node side by turning on the charge transfer transistor.

25 Claims, 4 Drawing Sheets

DYNAMIC MEMORY CELL AND DYNAMIC MEMORY

BACKGROUND OF THE INVENTION

1. Field of the Invention

The present invention relates to a semiconductor memory cell and semiconductor memory and, more particularly, to a dynamic memory cell requiring a refresh operation and a dynamic memory having an array of the memory cells.

2. Description of the Related Art

A one-transistor/one-capacitor type DRAM cell used in the conventional dynamic memory (DRAM) includes a charge transfer MOS transistor connected to a bit line and a word line, and a data storing capacitor connected to the MOS transistor. The DRAM cell itself does not have a refresh current supplying capability. It is necessary in the refresh operation that stored data are read onto the bit line side by turning on the charge transfer MOS transistor, and amplified by a sense amplifier and then rewritten into storage nodes from the bit line side. A refresh current is thus supplied.

When the DRAM cells are arranged in a matrix form to constitute a memory cell array, DRAM cells commonly connected to a bit line on the same column cannot be simultaneously refreshed if the refresh operation is effected on the bit line side by turning on the charge transfer transistor at the refreshing time as described above. At present, DRAM cells commonly connected to a word line on the same row are simultaneously refreshed. As a result, it becomes possible to simultaneously refresh only limited cells of a relatively small number determined by the word line unit in the memory cell array.

SUMMARY OF THE INVENTION

The present invention has been made to solve the above drawback, and an object of the present invention is to provide a dynamic memory cell which itself has a refresh current supplying capability and in which the refresh operation from the read/write node side by turning on the charge transfer transistor is not required, and the limitation on the data processing on the read/write node side in the refresh period can be reduced.

Another object of the present invention is to provide a dynamic memory in which all of the memory cells or a relatively large number of memory cells which can be freely selected in the memory cell array, for example, cells commonly connected to a bit line on the same column, can be simultaneously refreshed without effecting the read/write cycle.

According to an aspect of the present invention, there is provided a dynamic memory cell comprising: a first MOS transistor for transferring data, and having drain and source regions one of which is connected to a read/write node and a gate connected to a transfer gate control line; a second MOS transistor for storing data in a gate capacitor thereof, and having a gate connected to a first storage node on the other side of the drain and source regions of said first MOS transistor and source and drain regions one of which is connected to a first control terminal; a third MOS transistor for supplying a refresh current, and having source and drain regions one of which is connected to a second control terminal and the other of which is connected to said first storage node; delay means connected between the gate of said third MOS transistor and a second storage node on the other side of the drain and source regions of said second MOS transistor, for delaying an off operation of said third MOS transistor during a predetermined delay time after a turn-on of said second MOS transistor; and means for controlling a refreshing operation of the cell by respectively supplying first and second control signals to said first and second control terminals.

According to another aspect of the present invention, there is provided a dynamic memory cell comprising: a first MOS transistor for transferring data, and having drain and source regions one of which is connected to a read/write node and a gate connected to a transfer gate control line; a first thin film transistor for storing data in a gate capacitor thereof, and having a gate connected to a first storage node on the other side of the drain and source regions of said first MOS transistor and a conductive film forming source and drain regions thereof and connected at one end to a first control terminal; a second thin film transistor for supplying a refresh current, and having source and drain terminals one of which is connected to a second control terminal and the other of which is connected to said first storage node and a gate formed of the same conductive film as that constituting the drain and source regions of said first thin film transistor; delay means formed of the same conductive film as that of said first thin film transistor and connected between the gate of said second thin film transistor and a second storage node on the other side of the drain and source regions of said first thin film transistor, for delaying an off operation of said third MOS transistor during a predetermined delay time after a turn-on of said second MOS transistor; and means for controlling a refreshing operation of the cell by respectively supplying first and second control signals to said first and second control terminals.

According to still another aspect of the present invention, there is provided a dynamic memory comprising: a read/write node for communicating read/write data; a transfer gate control line for controlling transfer of data; a memory cell array formed of a plurality of dynamic memory cells arranged in a matrix form, each of said plurality of dynamic memory cells including: a first MOS transistor for transferring data, and having drain and source regions one of which is connected to a read/write node and a gate connected to a transfer gate control line; a second MOS transistor for storing data in a gate capacitor thereof, and having a gate connected to a first storage node on the other side of the drain and source regions of said first MOS transistor and source and drain regions one of which is connected to a first control terminal; a third MOS transistor for supplying a refresh current, and having source and drain regions one of which is connected to a second control terminal and the other of which is connected to said first storage node; and delay means connected between the gate of said third MOS transistor and a second storage node on the other side of the drain and source regions of said second MOS transistor, for delaying an off operation of said third MOS transistor during a predetermined delay time after a turn-on of said second MOS transistor and a control signal generation circuit for controlling a refresh operation of each of the memory cells by respectively supplying first and second control signals to said first and second control terminals of a preset number of memory cells of said memory cell array.

According to still another aspect of the present invention, there is provided a dynamic memory comprising: a read/write node for communication read/write data; a transfer gate control line for controlling transfer of data; a memory cell array formed of a plurality of dynamic memory cells arranged in a matrix form, each of said plurality of dynamic memory cells including: a first MOS transistor for transferring data, and having drain and source regions one of which is connected to a read/write node and a gate connected to said transfer gate control line; a first thin film transistor for storing data in a gate capacitor thereof, and having a gate connected to a first storage node on the other side of the drain and source regions of said first MOS transistor and a conductive film forming source and drain regions thereof and connected at one end to a first control terminal; a second thin film transistor for supplying a refresh current, and having source and drain terminals one of which is connected to a second control terminal and the other of which i connected to said first storage node and a gate formed of the same conductive film as that constituting the drain and source regions of said first thin film transistor; and delay means formed of the same conductive film as that of said first thin film transistor and connected between the gate of said second thin film transistor and a second storage node on the other side of the drain and source regions of said first thin film transistor, for delaying an off operation of said third MOS transistor during a predetermined delay time after a turn-on of said second MOS transistor: and a control signal generation circuit for controlling a refresh operation of each of the memory cells by respectively supplying first and second control signals to said first and second control terminals of a preset number of memory cells of said memory cell array.

In the above dynamic memory cell, the cell itself has the refresh current supplying capability and it is not necessary to effect the refresh operation on the read/write node side by turning on the charge transfer transistor. Therefore, the limitation on the data processing on the read/write node side in the refresh period can be reduced. When the cells are used to form a memory cell array, those of the cells which are commonly connected to a bit line on the same column can be simultaneously refreshed Further, in the above dynamic memory, since the cell itself has the refresh current supplying capability and the DRAM cell array in which it is not necessary to effect the refresh operation on the read/write node side after turning on the charge transfer transistor is used, the limitation on the data processing on the read/write node side in the refresh period can be reduced. All of the memory cells or a relatively large number of memory cells which can be freely selected in the memory cell array can be simultaneously refreshed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

There will now be described embodiments of a dynamic memory cell and dynamic memory according to the present invention in detail with reference to the accompanying drawings.

Figure 1:
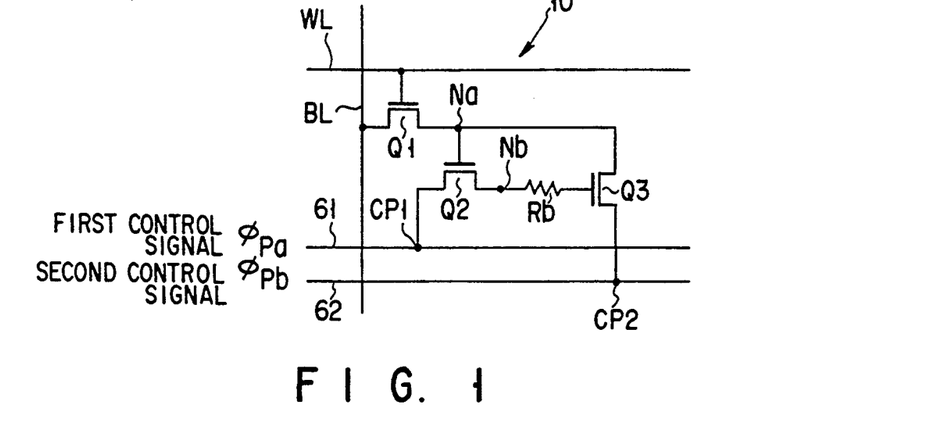
FIG. 1 is an equivalent circuit diagram showing the construction of a first embodiment of a DRAM cell of the present invention.

FIG. 1 is an equivalent circuit diagram showing the construction of a first embodiment of a dynamic memory (DRAM) cell of the present invention. The DRAM cell 10 includes a first N-channel MOS transistor Q1 for charge transfer, a second N-channel MOS transistor Q2 whose gate capacitor is used as a data storage capacitor, a third N-channel MOS transistor Q3 for refresh current supply, and a resistor element Rb serving as a delay means. In the DRAM cell 10, one of the drain and source terminals of the first N-channel MOS transistor Q1 is connected to a read/write node, for example, a bit line BL, and the gate thereof is connected to a transfer gate control line, for example, a word line WL. The gate of the second N-channel MOS transistor Q2 is connected to the other terminal of the first N-channel MOS transistor Q1, that is, a first storage node Na. One of the drain and source terminals thereof is connected to a first control signal supplying line 61 at a first control terminal CP1, and the other terminal thereof is connected to a second storage node Nb. One of the drain and source terminals of the third N-channel MOS transistor Q3 is connected to a second control signal supplying line 62 at a second control terminal CP2, and the other terminal thereof is connected to the first storage node Na. Further, the gate of the third transistor Q3 is connected to the other terminal of the second transistor Q2, that is, the second storage node Nb via the resistor element Rb. The first control terminal CP1 is supplied with a first control signal $\phi_{pa}$. The second control terminal CP2 is supplied with a second control signal $\phi_{pb}$. Data is stored in the gate capacitor of the second transistor Q2, that is, the data storage capacitor.

Figure 2:
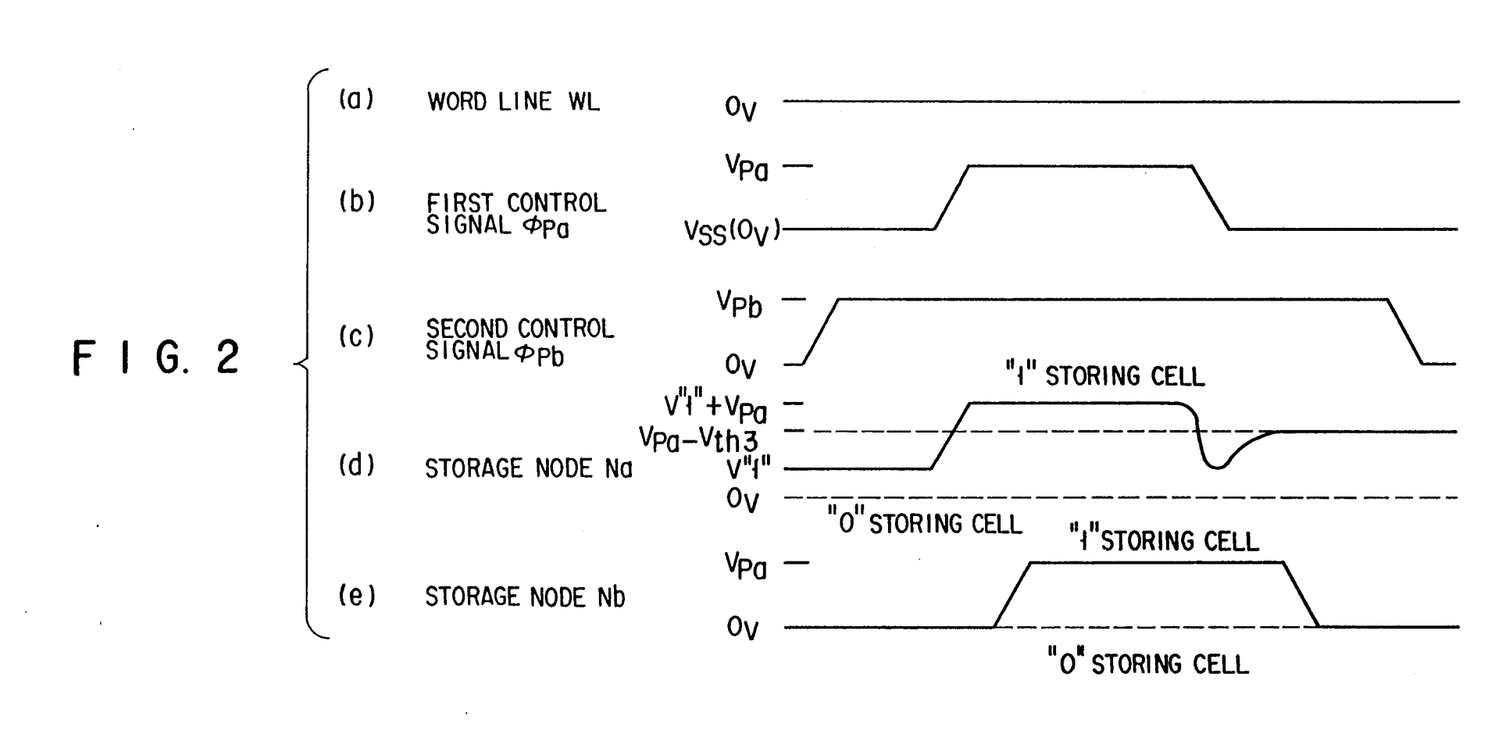
FIG. 2 is a timing waveform diagram for illustrating the refresh operation of the DRAM cell shown in FIG. 1.

The operation of the DRAM cell of FIG. 1 is explained with reference to FIG. 2. First, upon the write/read operation of the DRAM cell 10, the first control signal $\phi_{pa}$ and the second control signal $\phi_{pb}$ are set to a reference potential, for example, ground potential Vss. As a result, the third transistor Q3 is set in the OFF state. Data can be transferred between the bit line BL and the first storage node Na by turning on the first transistor Q1 in this condition. The write/read operation can be effected in the same manner as that of the conventional one-transistor/one-capacitor type DRAM cell.

The refresh operation of the DRAM cell 10 is then explained. For example, the operation is effected in accordance with the timing waveform diagram of FIG. 2. More particularly, the word line WL is held in the OFF state. First, the second control signal $\phi_{pb}$ of FIG. 2(c) is raised to a preset potential Vpb which is higher than a power source potential Vcc. The first signal $\phi_{pa}$ of FIG. 2(b) is then raised to a preset potential Vpa, for example, Vpa=Vpb, which is also higher than the power source potential Vcc. At this time, in a DRAM cell of the "1" state where data "1" i.e., high level is stored in the first storage node Na, the second transistor Q2 is set in the ON state. The potential Va of the first storage node Na in this state is indicated by V"1". As a result, a capacitor is created between the gate of the second transistor Q2 and the first control terminal CP1. As shown in FIG. 2(d), the potential Va of the first storage node Na is thus raised to a potential V"1"+Vpa by the capacitive coupling. As a result, as shown in FIG. 2(e), the potential Vb of the second storage node Nb is set to a lower potential, in this example, potential Vpa, of the potential V"1"+Vpa−Vth2 and the potential Vpa of the first control terminal CP1. In this case, a voltage Vth2 is a gate threshold voltage of the second transistor Q2. When the potential Nb of the second storage node Nb is applied to the gate of the third transistor Q3 via the resistor element Rb, the third transistor Q3 is turned on. A potential Vpa−Vth3 is then applied to the first storage node Na, as shown in FIG. 2(d). In this case, a voltage Vth3 is a threshold voltage of the third transistor Q3. Next, if the first control signal $\phi_{pa}$ of FIG. 2(b) is lowered to the reference potential Vss, the potential Va of the first storage node Na tends to be lowered to the potential V"1" of FIG. 2(d) by the capacitive coupling. However, the potential Vb of the second storage node Nb is still held during a period of time defined by the time constant, which is determined by the resistor element Rb and the capacitance of the second storage node Nb. Since the third transistor Q3 is set in the ON state during this period of time, a refresh current is supplied from the second control terminal CP2 to the first storage node Na via the third transistor Q3. Therefore, the potential of the first storage node Na is returned to the potential Vpa−Vth3. The DRAM cell is thus refreshed. After the refresh operation, the second control signal $\phi_{pb}$ of FIG. 2(c) is lowered to the reference potential Vss.

On the other hand, in a DRAM cell of the "0" state where data "0", i.e., low level is stored in the first storage node Na, no inversion layer is formed i the channel region of the second transistor Q2. The potential Va of the first storage node Na in this state is indicated by V"0". Even if the second control signal $\phi_{pb}$ and the first control signal $\phi_{pa}$ are sequentially raised in order to effect the refresh operation, the potential Va of the first storage node Na will not be raised As shown by broken lines in FIGS. 2(d) and 2(e), the potential Va of the first storage node Na and the potential Vb of the second storage node Nb are kept unchanged and kept at the potential Vss. Therefore, after this, even if the first control signal $\phi_{pa}$ and the second control signal $\phi_{pb}$ are sequentially lowered, the potential Va of the first storage node Na and the potential Vb of the second storage node Nb are kept unchanged. Thus, the DRAM cell of the "0" state is not influenced by the refresh operation. The condition V"1">Vth2 is necessary for preventing the potential Va of the first storage node Na from being raised when the first control signal $\phi_{pa}$ is raised in the DRAM cell of the "0" state.

According to the DRAM cell 10 of the above embodiment, the cell itself has the refresh current supplying capability. The refresh operation which is effected from the read/write node side by turning on the charge transfer transistor Q1 is not required. Therefore, the limitation on the data processing on the read/write node side during the refresh period can be reduced. Consequently, when a memory cell array is formed by use of the DRAM cells, the cells commonly connected to the bit line on the same column can be simultaneously refreshed.

Figure 3:
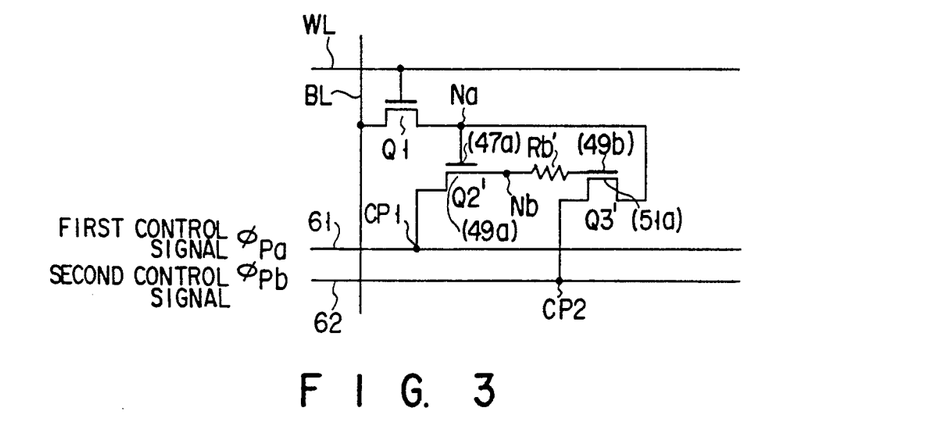
FIG. 3 is an equivalent circuit diagram showing the construction of a second embodiment of a DRAM cell of the present invention.

FIG. 3 is an equivalent circuit diagram showing the construction of a second embodiment of a DRAM cell of the present invention. The DRAM cell of the second embodiment is similar to the DRAM cell of the first embodiment shown in FIG. 1 except that a second transistor Q2' and a third transistor Q3' are respectively formed of a thin film transistor (TFT), a resistor element Rb' used as the delay means is formed of the same thin film as the thin film for the active region of the second transistor Q2' and the thin film for the gate electrode of the third transistor Q3'.

Figure 4:
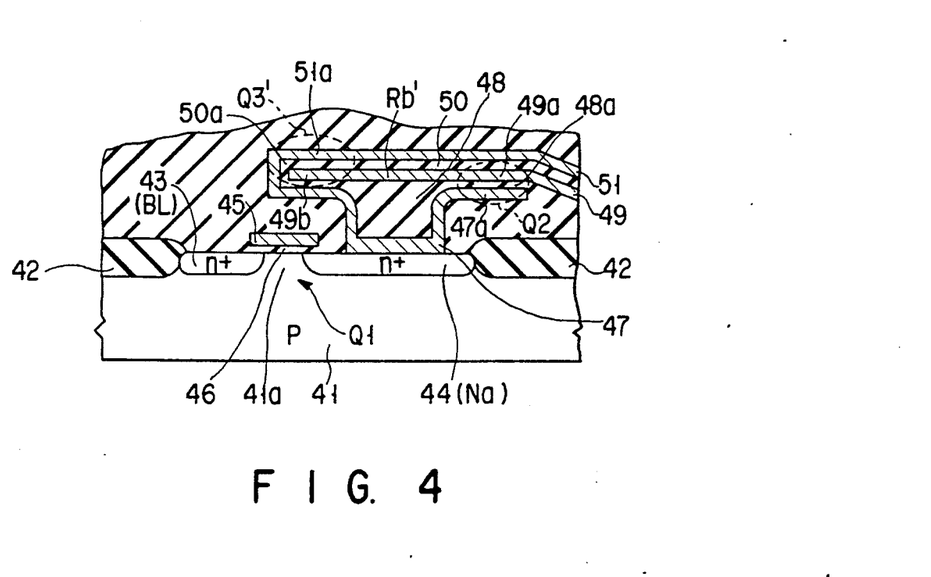
FIG. 4 is a cross sectional view schematically showing the structure of the DRAM shown in FIG. 3.

FIG. 4 is a cross sectional view schematically showing the cross sectional structure of the DRAM shown in FIG. 3. Element isolation regions 42 are selectively formed in the surface area of a P-type semiconductor substrate 41. A drain region 43 and a source region 44 of the first transistor Q1 which are formed of an n+ region are selectively formed between the element isolation regions 42. A gate electrode 45 of the first transistor Q1 is formed through a gate insulation film 46 over a channel region 41a between the drain and source regions of the semiconductor substrate 41. The source region 44 of the first transistor Q1 serves as the first storage node Na, that is, the charge storage node. A first conductive film (thin film) 47 is formed in contact with the source region 44 as shown in FIG. 4. A second conductive film (thin film) 49 of high resistance is formed over the first conductive film 47 with an insulation film 48 disposed therebetween. Part of the second conductive film 49 is formed as the resistor element Rb' of FIG. 3. One end of the second conductive film 49 is connected to the first control terminal CPI of FIG. 3. A third conductive film (thin film) 51 is formed over the second conductive film 49 with an insulation film 50 disposed therebetween. One end of the third conductive film 51 is connected to the second control terminal CP2 of FIG. 3 and the other end thereof is connected to one end of the first conductive film 47. In order to reduce the area occupied by the DRAM cell, a second transistor is formed over the element isolation region 42 and a third transistor Q3' is formed over the first transistor Q1.

Figure 5:
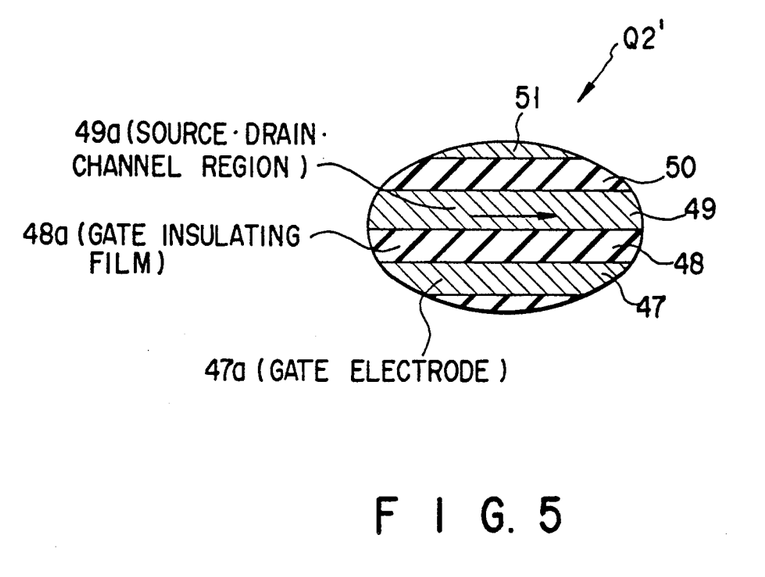
FIG. 5 is a cross sectional view showing an enlarged portion of a second transistor Q2' shown in FIG. 3.

As shown in the enlarged view of FIG. 5, part of the first conductive film 47 is formed as a gate electrode 47a of the second transistor Q2'. Part of the second conductive film 49 is formed as active regions of the second transistor Q2', that is, the source, drain and channel regions 49a. A gate insulation film 48a disposed between the gate electrode 47a and active region 47a constitutes a first capacitor. Data is stored in the first capacitor in the form of a potential.

Figure 6:
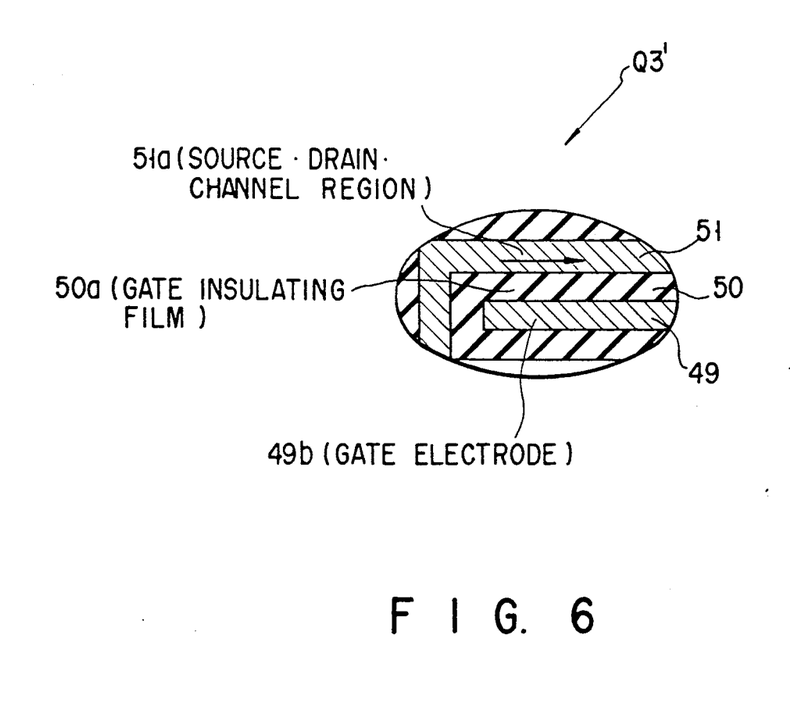
FIG. 6 is a cross sectional view showing an enlarged portion of a third transistor Q3' shown in FIG. 3.

As shown in the enlarged view of FIG. 6, part of the second conductive film 49 is formed as a gate electrode 49b of the third transistor Q3'. That is, the resistor element Rb' is formed between the active region 49a of the second transistor Q2' and the gate electrode 49b of the third transistor Q3'. Part of the third conductive film 51 is formed as an active region 51a, that is, the source, drain and channel regions 51a of the third transistor Q3'. A gate insulation film 50a disposed between the gate electrode 49b and the active region 51a constitutes a second capacitor. The capacitance of the second capacitor as well as the resistance value of the resistor element Rb' are determined so as to define a preset time constant at the time of change of data.

According to the structure of FIG. 4, the second transistor Q2' and third transistor Q3' both formed of TFTs are formed over the first transistor Q1. The memory cell can be realized with substantially the same cell size as the conventional one-transistor/ one-capacitor type DRAM cell.

Figure 7:
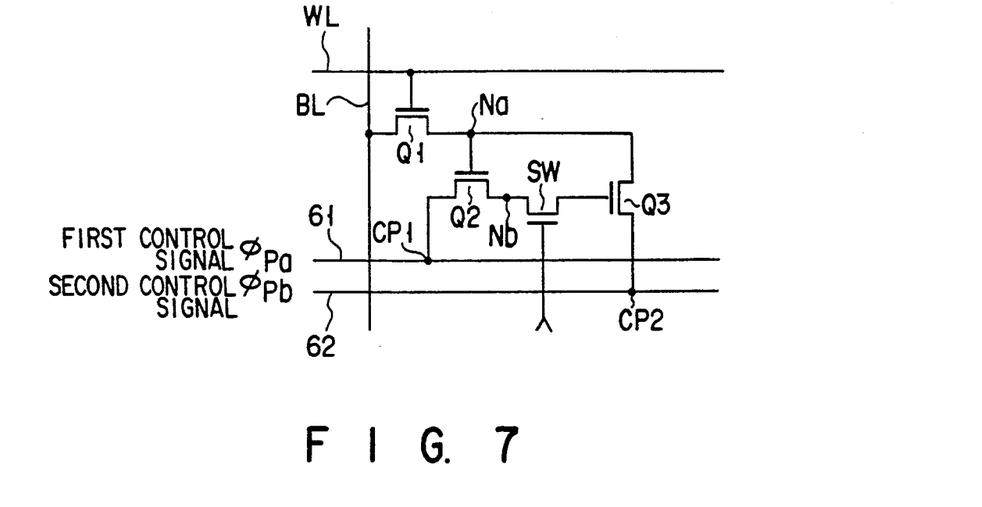
FIG. 7 is an equivalent circuit diagram showing the construction of a third embodiment of a DRAM cell of the present invention.

FIG. 7 is an equivalent circuit diagram showing the construction of a third embodiment of a DRAM cell of the present invention. The DRAM cell is similar to the DRAM cell shown in FIG. 1 except that a switching element SW formed of a fourth N-channel MOS transistor is used as the delay means instead of the resistor element Rb. The remaining portions are the same as those in the DRAM cell of FIG. 1 and are denoted by the same reference numerals. With the above DRAM cell, the switching element SW may be used to effect substantially the same operation as the resistor element Rb, if the switching element SW is set into the ON state to reduce the resistance thereof when or immediately before the first control signal $\phi_{pa}$ is raised to the preset high potential Vpa and if the switching element SW is set into the OFF state to increase the resistance thereof when or immediately before the first control signal $\phi_{pa}$ is lowered to the reference potential Vss. Therefore, the DRAM cell can effect substantially the same operation as the DRAM cell shown in FIG. 1

Figure 8:
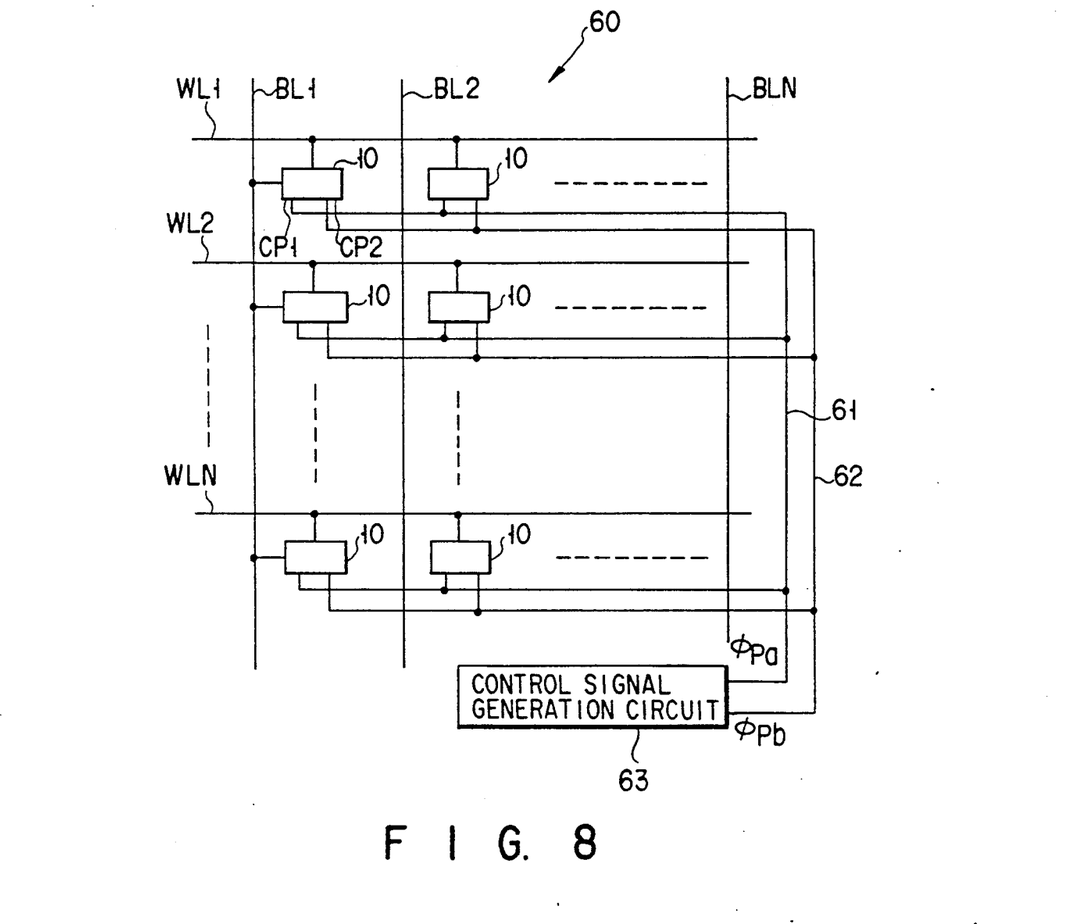
FIG. 8 is a circuit diagram showing the construction of an embodiment of a DRAM of the present invention using the DRAM cells shown in FIG. 7.

FIG. 8 is a circuit diagram showing the construction of one embodiment of a dynamic memory (DRAM) according to the present invention. A memory cell array 60 is formed of DRAM cells of the present invention, for example, DRAM cell shown in FIG. 10, arranged in a matrix form. The DRAM cells 10 on the same column are commonly connected to a corresponding one of bit lines BL1, BL2,—and the DRAM cells on the same row are commonly connected to a corresponding one of word lines WL1, WL2,—. In this example, in all of the DRAM cells 10 in the memory cell array 60 or a predetermined number of the DRAM cells 10 in each of a plurality of blocks obtained by dividing the memory cell array 60, first control terminals CP1 are commonly connected to a first control signal supplying line 61 and second control terminals CP2 are commonly connected to a second control signal supplying line 62. Further, a control signal generation circuit 63 is provided on the same chip as the memory cell array 60. The control signal generation circuit 63 generates the first control signal $\phi_{pa}$ and second control signal $\phi_{pb}$ and supplies them to the first control signal supplying line 61 and second control signal supplying line 62, respectively. The first and second control signals $\phi_{pa}$ and $\phi_{pb}$ vary in a pulse configuration between the reference potential Vss and the preset potential higher than the power source potential Vcc as described before with reference to FIG. 2. It is also possible to supply the second control signal $\phi_{pb}$ for refresh current supply and/or the first control signal $\phi_{pa}$ for voltage raising from the exterior of the chip via a terminal (not shown). Further, the block divisions can be attained by dividing the memory cell array for each column, for each of sub-arrays which are divisions of the memory cell array, or for each desired division unit.

According to the above DRAM, since the memory cell array 61 having the DRAM cells 10 each of which has the refresh current supplying capability and in which it is not necessary to effect the refresh operation on the read/write node side by turning on the charge transfer transistor is used, the limitation on the data processing on the read/write node side during the refresh period can be reduced. All of the memory cells in the memory cell array or a relatively large number of memory cells which can be freely selected can be simultaneously refreshed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A dynamic memory cell comprising:
    a first MOS transistor for transferring data, and having drain and source regions one of which is connected to a read/write node and a gate connected to a transfer gate control line;
    a second MOS transistor for storing data in a gate capacitor thereof, and having a gate connected to a first storage node on the other side of the drain and source regions of said first MOS transistor and source and drain regions one of which is connected to a first control terminal;
    a third MOS transistor for supplying a refresh current, and having source and drain regions one of which is connected to a second control terminal and the other of which is connected to said first storage node;
    delay means connected between the gate of said third MOS transistor and a second storage node on the other side of the drain and source regions of said second MOS transistor, for delaying an off operation of said third MOS transistor during a predetermined delay time after a turn-on of said second MOS transistor; and
    means for controlling a refreshing operation of the cell by respectively supplying first and second control signals to said first and second control terminals.

2. A dynamic memory cell according to claim 1, wherein a capacitance of said second storage node and a predetermined value of said delay means determine the refresh current supplying cycle.

3. A dynamic memory cell according to claim 1, wherein said delay means is a resistor element.

4. A dynamic memory cell according to claim 1, wherein said delay means is a switching element.

5. A dynamic memory cell according to claim 4, wherein said switching element is constituted by a fourth MOS transistor.

6. A dynamic memory cell comprising:
    a first MOS transistor for transferring data, and having drain and source regions one of which is connected to a read/write node and a gate connected to a transfer gate control line;

a first thin film transistor for storing data in a gate capacitor thereof, and having a gate connected to a first storage node on the other side of the drain and source regions of said first MOS transistor and a conductive film forming source and drain regions thereof and connected at one end to a first control terminal;

a second thin film transistor for supplying a refresh current, and having source and drain terminals one of which is connected to a second control terminal and the other of which is connected to said first storage node and a gate formed of the same conductive film as that constituting the drain and source regions of said first thin film transistor;

delay means formed of the same conductive film as that of said first thin film transistor and connected between the gate of said second thin film transistor and a second storage node on the other side of the drain and source regions of said first thin film transistor, for delaying an off operation of said third MOS transistor during a predetermined delay time after a turn-on of said second MOS transistor; and means for controlling a refreshing operation of the cell by respectively supplying first and second control signals to said first and second control terminals.

7. A dynamic memory cell according to claim 6, wherein a capacitance of said second storage node an a predetermined value of said delay means determine the refresh current supplying cycle.

8. A dynamic memory cell according to claim 6, wherein said delay means is a resistor element.

9. A dynamic memory cell according to claim 6, wherein said second and third transistors are formed over an area of said MOS transistor.

10. A dynamic memory comprising:

a read/write node for communicating read/write data;

a transfer gate control line for controlling transfer of data;

a memory cell array formed of a plurality of dynamic memory cells arranged in a matrix form, each of said plurality of dynamic memory cells including:

a first MOS transistor for transferring data, and having drain and source regions one of which is connected to a read/write node and a gate connected to a transfer gate control line;

a second MOS transistor for storing data in a gate capacitor thereof, and having a gate connected to a first storage node on the other side of the drain and source regions of said first MOS transistor and source and drain regions one of which is connected to a first control terminal;

a third MOS transistor for supplying a refresh current, and having source and drain regions one of which is connected to a second control terminal and the other of which is connected to said first storage node; and delay means connected between the gate of said third MOS transistor and a second storage node on the other side of the drain and source regions of said second MOS transistor, for delaying an off operation of said third MOS transistor during a predetermined delay time after a turn-on of said second MOS transistor; and a control signal generation circuit for controlling a refresh operation of each of the memory cells by respectively supplying first and second control signals to said first and second control terminals of a preset number of memory cells of said memory cell array.

11. A dynamic memory according to claim 10, wherein said control signal generation circuit is formed on the same chip as said memory cell array.

12. A dynamic memory according to claim 10, wherein said control signal generation circuit includes a terminal for supplying said control signal from the exterior of the chip.

13. A dynamic memory according to claim 10, wherein said control signal generation circuit sequentially raises the potential of the second control signal and the potential of the first control signal, and after a preset period of time, sequentially lowers the potential of the first control signal and the potential of the second control signal to refresh the dynamic memory cell.

14. A dynamic memory according to claim 10, wherein said control signal generation circuit changes the control signal between a reference potential and a preset potential higher than a power source potential in a pulse configuration.

15. A dynamic memory according to claim 10, wherein said control signal generation circuit sets the potentials of the first and second control signals to the reference potential at the time of read/write operation of said dynamic memory cell to turn off said third MO transistor.

16. A dynamic memory according to claim 10, wherein said read/write node is a bit line.

17. A dynamic memory according to claim 10, wherein said transfer gate control line is a word line.

18. A dynamic memory comprising:

a read/write node for communication read/write data;

a transfer gate control line for controlling transfer of data;

a memory cell array formed of a plurality of dynamic memory cells arranged in a matrix form, each of said plurality of dynamic memory cells including:

a first MOS transistor for transferring data, and having drain and source regions one of which is connected to a read/write node and a gate connected to said transfer gate control line;

a first thin film transistor for storing data in a gate capacitor thereof, and having a gate connected to a first storage node on the other side of the drain and source regions of said first MOS transistor and a conductive film forming source and drain regions thereof and connected at one end to a first control terminal;

a second thin film transistor for supplying a refresh current, and having source and drain terminals one of which is connected to a second control terminal and the other of which is connected to said first storage node and a gate formed of the same conductive film as that constituting the drain and source regions of said first thin film transistor; and delay means formed of the same conductive film as that of said first thin film transistor and connected between the gate of said second thin film transistor and a second storage node on the other side of the drain and source regions of said first thin film transistor, for delaying an off operation of said third MOS transistor during a predetermined delay time after a turn-on of said second MOS transistor; and a control signal generation circuit for controlling a refresh operation of each of the memory cells by respectively supplying first and second control signals to said first and second control terminals of a preset number of memory cells of said memory cell array.

19. A dynamic memory according to claim 18, wherein said control signal generation circuit is formed on the same chip as said memory cell array.

20. A dynamic memory according to claim 18, wherein said control signal generation circuit includes a terminal for supplying said control signal from the exterior of the chip.

21. A dynamic memory according to claim 18, wherein said control signal generation circuit sequentially raises the potential of the second control signal and the potential of the first control signal, and after a preset period of time, sequentially lowers the potential of the first control signal and the potential of the second control signal to refresh the dynamic memory cell.

22. A dynamic memory according to claim 18, wherein said control signal generation circuit changes the control signal between a reference potential and a preset potential higher than a power source potential in a pulse configuration.

23. A dynamic memory according to claim 18, wherein said control signal generation circuit sets the potentials of the first and second control signals to the reference potential at the time of read/write operation of said dynamic memory cell to turn off said second thin film transistor.

24. A dynamic memory according to claim 18, wherein said read/write node is a bit line.

25. A dynamic memory according to claim 18, wherein said transfer gate control line is a word line.

* * * * *

UNITED STATES PATENT AND TRADEMARK OFFICE
CERTIFICATE OF CORRECTION

PATENT NO. : 5,262,988
DATED : November 16, 1993
INVENTOR(S) : Kiyofumi OCHII

It is certified that error appears in the above-indentified patent and that said Letters Patent is hereby corrected as shown below:

Claim 7, column 9, line 30, change "an" to --and--.

Claim 15, column 10, line 30, change "MO" to --MOS--.

Signed and Sealed this

Twenty-third Day of August, 1994

Attest:

BRUCE LEHMAN

Attesting Officer     Commissioner of Patents and Trademarks